(12) United States Patent
Nagai et al.

(10) Patent No.: US 9,064,846 B2
(45) Date of Patent: Jun. 23, 2015

(54) SEMICONDUCTOR DEVICE

(71) Applicant: Mitsubishi Electric Corporation, Tokyo (JP)

(72) Inventors: Miho Nagai, Tokyo (JP); Yuji Imoto, Tokyo (JP); Osamu Usui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/246,475

(22) Filed: Apr. 7, 2014

(65) Prior Publication Data

US 2015/0061111 A1 Mar. 5, 2015

(30) Foreign Application Priority Data

Sep. 5, 2013 (JP) .................................. 2013-183924

(51) Int. Cl.
*H01L 23/34* (2006.01)
*H01L 23/46* (2006.01)

(52) U.S. Cl.
CPC ...................................... *H01L 23/46* (2013.01)

(58) Field of Classification Search
CPC .. H01L 23/473; H01L 23/427; H01L 2224/16
USPC .......... 257/E23.097, E23.088, 704, 706, 707, 257/712, 713, 714, 718, 720, 723, 796; 438/117, 122, 124–127; 361/52, 64, 361/699, 702, 710
See application file for complete search history.

(56) References Cited

U.S. PATENT DOCUMENTS

| | | | | |
|---|---|---|---|---|
| 5,966,291 A * | 10/1999 | Baumel et al. | ................. | 361/707 |
| 6,166,937 A * | 12/2000 | Yamamura et al. | ........... | 363/141 |
| 7,144,797 B2 * | 12/2006 | Chow et al. | ................... | 438/549 |
| 7,569,957 B2 | 8/2009 | Aoki et al. | | |
| 7,755,898 B2 | 7/2010 | Aoki et al. | | |
| 7,859,103 B2 * | 12/2010 | Aoki et al. | .................... | 257/714 |
| 8,072,760 B2 * | 12/2011 | Matsuo et al. | ................ | 361/707 |
| 8,405,204 B2 * | 3/2013 | Hasegawa | ...................... | 257/714 |
| 8,472,188 B2 * | 6/2013 | Horiuchi et al. | .............. | 361/699 |
| 8,604,608 B2 | 12/2013 | Tsuchiya et al. | | |
| 2001/0014029 A1 * | 8/2001 | Suzuki et al. | ................. | 363/141 |
| 2008/0216991 A1 | 9/2008 | Oikawa | | |

FOREIGN PATENT DOCUMENTS

| | | | |
|---|---|---|---|
| JP | 2005-136278 A | | 5/2005 |
| JP | 2005-197562 A | | 7/2005 |
| JP | 2008-172024 A | | 7/2008 |
| JP | 2008-218589 A | | 9/2008 |
| JP | 2008-294067 A | | 12/2008 |
| JP | 2013-016615 A | | 1/2013 |

* cited by examiner

*Primary Examiner* — Jerome Jackson, Jr.
(74) *Attorney, Agent, or Firm* — Studebaker & Brackett PC (57) ABSTRACT

A semiconductor device includes a semiconductor element, a base plate having an upper surface on which the semiconductor element is mounted, a cooling fin disposed on a lower surface of the base plate, a jacket disposed in a sealing manner on the lower surface of the base plate, the jacket surrounding the cooling fin, and a header partition wall formed separately from the jacket and fixed to the jacket on the lower side of the cooling fin in the jacket, the header partition wall forming a header and a flow path for causing a refrigerant flow to the cooling fin.

8 Claims, 9 Drawing Sheets

SEMICONDUCTOR DEVICE

BACKGROUND OF THE INVENTION

1. Field of the Invention

The present invention relates to a cooling structure for a semiconductor device used for an inverter and a regenerative converter that control motors of electric vehicles and trains, for example.

2. Description of the Background Art

In a semiconductor device, a direct-cooled cooling structure in which cooling fins are provided on a lower surface of a base plate on which semiconductor elements are mounted is a structure in which sealing is performed to a jacket through a sealing structure. To equalize flow velocity of refrigerant flowing through the cooling fins, a structure is common in which a header causing the refrigerant flow in the cooling fins is provided on an inflow side and an outflow side of the refrigerant in the cooling fins, in other words, horizontal to the cooling fins.

When the semiconductor elements are mounted on the jacket through the base plate, not only the region of the base plate in which the cooling fins are formed but also the region in which the header is disposed needs to be sealed. Thus, the base plate in larger size than the region in which the cooling fins are formed is used.

Semiconductor devices are conventionally configured as described above, so that although semiconductor elements are minimized, reducing size of base plates is difficult. Thus, miniaturization of semiconductor devices is difficult.

Moreover, in a case where semiconductor devices are mounted on a vehicle, there are restrictions on pressure loss in cooling system of each device, and for example, a cooling structure in a semiconductor device is required to have pressure loss of 10 kPa or less when flow amount of refrigerant is 10 L/min. In order to reduce the semiconductor device in size while satisfying the restrictions, a header is needed to be reduced in size or to be removed. Consequently, pressure loss increases, whereby flow amount of the refrigerant fails to increase.

Furthermore, the header lacks capacity, so that equalizing flow velocity of the refrigerant flowing through the cooling fins is insufficient, which may lead to deterioration of cooling performances. For the reasons as mentioned above, reducing semiconductor devices in size has been difficult.

For example, Japanese Patent Application Laid-Open No. 2008-172024 discloses a structure providing a header on a lower side of cooling fins. In this structure, the header is provided on the lower side of the cooling fins, so that a base plate can be reduced in size, resulting in miniaturization of a semiconductor device.

The structure, disclosed in Japanese Patent Application Laid-Open No. 2008-172024, provides a partition wall that forms the header and a flow path in a jacket. However, undercut portions are generated on a periphery of the partition wall in a process of the jacket, whereby workability of the jacket deteriorates.

SUMMARY OF THE INVENTION

It is an object of the present invention to provide a technique capable of minimizing a semiconductor device and improving workability of a jacket.

The semiconductor device according to the present invention includes a semiconductor element, a base plate having an upper surface on which the semiconductor element is mounted, a cooling fin disposed on a lower surface of the base plate, and a jacket disposed in a sealing manner on the lower surface of the base plate, the jacket surrounding the cooling fin. The semiconductor device further includes a header partition wall formed separately from the jacket and fixed to the jacket on the lower side of the cooling fin in the jacket, the header partition wall forming a header and a flow path for causing a refrigerant flow to the cooling fin.

The semiconductor device according to the present invention includes a semiconductor element, a base plate having an upper surface on which the semiconductor element is mounted, a cooling fin disposed on a lower surface of the base plate, a jacket disposed in a sealing manner on the lower surface of the base plate, the jacket surrounding the cooling fin, and a header partition wall formed separately from the jacket and fixed to the jacket on the lower side of the cooling fin in the jacket, the header partition wall forming a header and a flow path for causing a refrigerant flow to the cooling fin.

Therefore, with the cooling fin and the header disposed in a vertical direction, only the region of the base plate in which the cooling fin is formed needs to be sealed, whereby the base plate can be reduced in size and thus the semiconductor device can be minimized. The header partition wall is formed separately from the jacket, so that generation of undercut portions can be prevented in a process of the jacket, whereby workability of the jacket can be improved.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
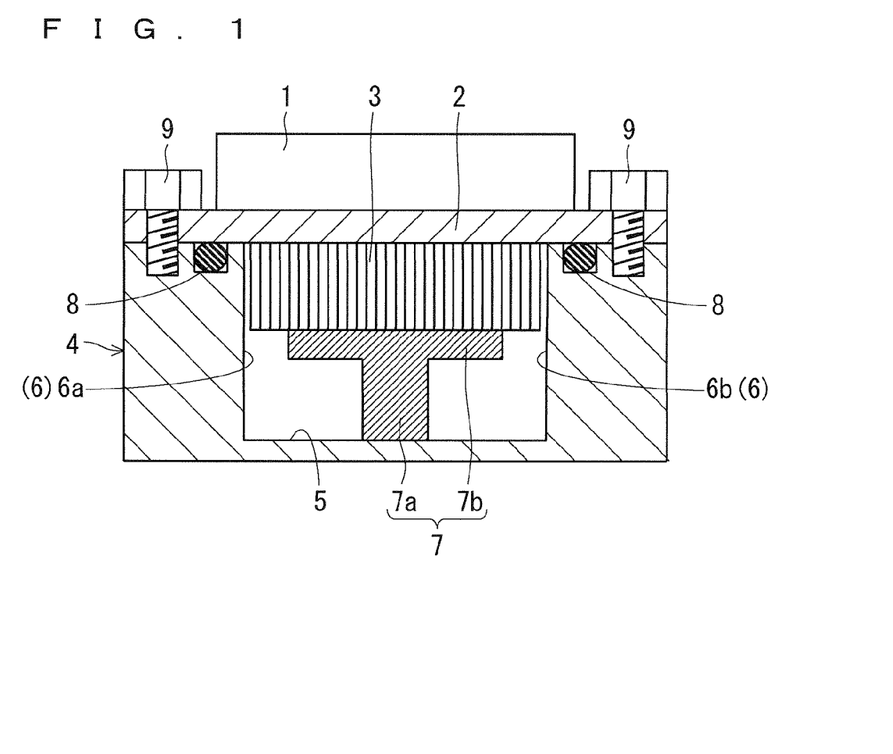
FIG. 1 is a schematic cross sectional view of a semiconductor device according to a first preferred embodiment.

A first preferred embodiment of the present invention will be described below with reference to the drawings. FIG. 1 is a schematic cross sectional view of a semiconductor device according to the first preferred embodiment. The semiconductor device includes a semiconductor element 1, a base plate 2, cooling fins 3, a jacket 4, and a header partition wall 7. The semiconductor element 1 is, for example, a wide band gap semiconductor element and mounted on an upper surface of the base plate 2.

The plurality of cooling fins 3 are disposed on the lower surface of the base plate 2. More specifically, the plurality of cooling fins 3 are disposed, on the lower surface of the base plate 2, in a region corresponding to a region where the semiconductor element 1 mounted on the upper surface of the base plate 2 is disposed. The cooling fins 3 are disposed with a predetermined space therebetween such that they protrude downward from the lower surface of the base plate 2. The cooling fins 3, for example, are made of high thermal conductivity metal which can enhance heat dissipation effects.

The jacket 4 is a structural component for causing a refrigerant flow to the cooling fins 3 and is formed into a concave shape. The jacket 4 is disposed in a sealing manner on the lower surface of the base plate 2, the jacket 4 surrounding the cooling fins 3. More specifically, the jacket 4 is fixed to an outer periphery of the region where the cooling fins 3 are formed with fastening bolts 9 through an O-ring 8 so as to be closely adhered to the lower surface of the base plate 2.

The header partition wall 7 is formed separately from the jacket 4 and formed into a T-shape with a vertical partition wall 7a and a horizontal partition wall 7b. A lower end portion of the vertical partition wall 7a is fixed to a bottom wall of the jacket 4 with a bolt or the like to fix the header partition wall 7 inside the jacket 4. The header partition wall 7 forms a header 5 and a flow path 6 for causing the refrigerant flow to the cooling fins 3 with an inner wall and the bottom wall of the jacket 4.

The header 5 is formed in a lower portion inside the jacket 4 to temporarily retain the refrigerant. The flow path 6 is formed in an upper portion inside the jacket 4. The flow path 6 includes an inflow-side opening 6a causing the refrigerant to flow into the cooling fins 3 and an outflow-side opening 6b causing the refrigerant to flow out from the cooling fins 3.

As to the inflow-side opening 6a and the outflow-side opening 6b, a lower end of the cooling fins 3 contacts an upper surface of the horizontal partition wall 7b, and the inflow-side opening 6a is formed between the inner wall of the header 5 (inner wall on left side in FIG. 1) and one of the side surfaces of the horizontal partition wall 7b (left side surface in FIG. 1). The outflow-side opening 6b is formed between the inner wall of the header 5 (inner wall on right side in FIG. 1) and the other side surface of the horizontal partition wall 7b (right side surface in FIG. 1).

Next, flow of the refrigerant inside the jacket 4 will be described. The refrigerant at low temperature flows into the cooling fins 3 through the inflow-side opening 6a from the header 5. Upon the refrigerant at low temperature flowing through the cooling fins 3, heat exchange takes place. After the refrigerant at high temperature as a result of the heat exchange flows out to the header 5 from the outflow-side opening 6b, it is discharged to the outside. The refrigerant flows out from and flows into the header 5 through an inflow portion 14 (see FIG. 9) and an outflow portion 15 (see FIG. 9) provided on an outer periphery of the jacket 4, which will be described in a fourth preferred embodiment.

Figure 2:
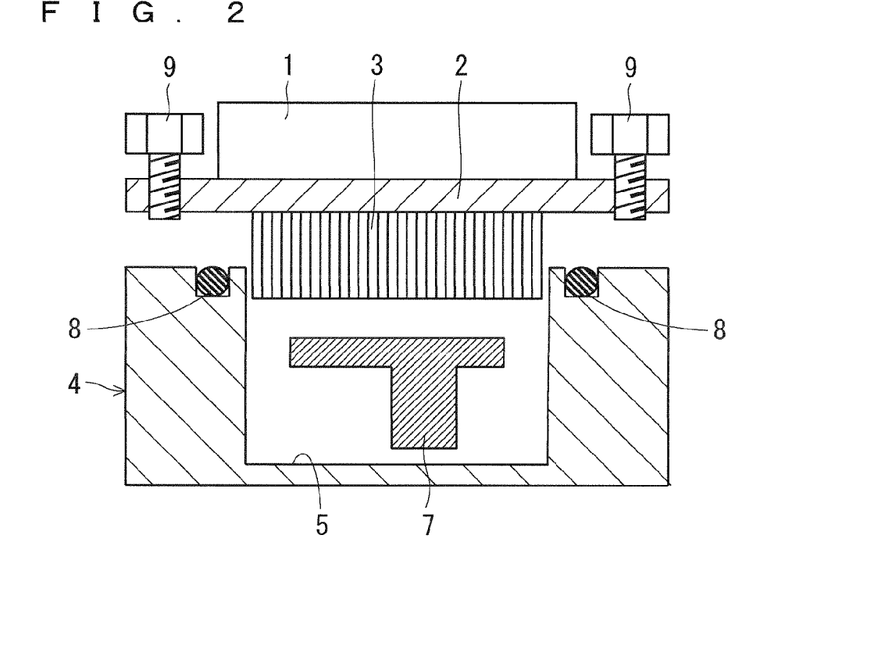
FIG. 2 is a schematic cross sectional view showing a state during exchanging for the other header partition wall in the semiconductor device according to the first preferred embodiment.
Figure 3:
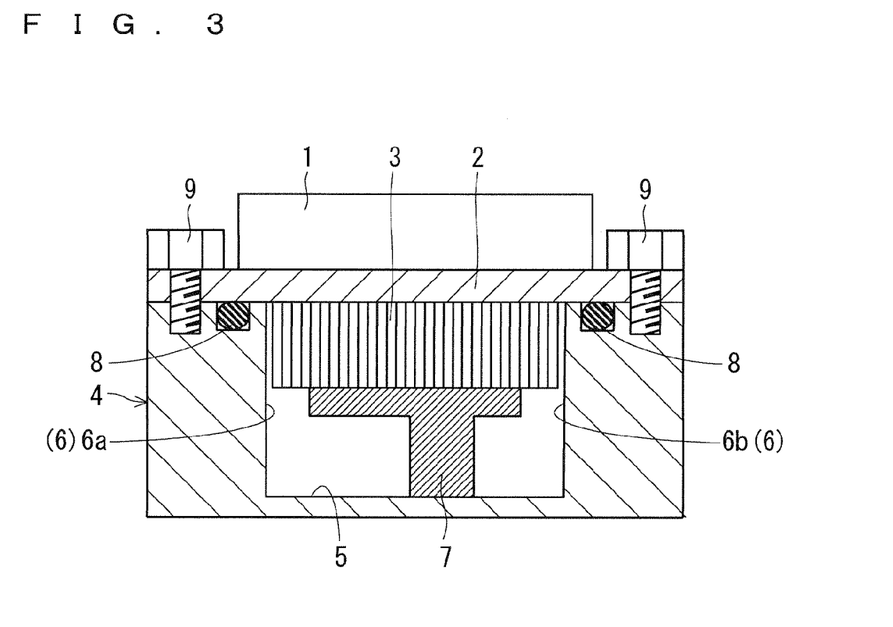
FIG. 3 is a schematic cross sectional view showing a state after exchanging for the other header partition wall in the semiconductor device according to the first preferred embodiment.

As described above, the header partition wall 7 is formed separately from the jacket 4, allowing for an exchange. In other words, the header partition wall 7 is exchangeable in response to, for example, a change in shapes (change in specifications) of the cooling fins 3. FIG. 2 is a schematic cross sectional view showing a state during exchanging for the other header partition wall 7 in the semiconductor device according to the first preferred embodiment. FIG. 3 is a schematic cross sectional view showing a state after exchanging for the other header partition wall 7. As shown in FIGS. 2 and 3, the header partition wall 7 is formed into a shape in which the vertical partition wall 7a is located toward the outflow-side opening 6b side.

The header partition wall 7 forms the header 5 and the flow path 6 with the inner wall and the bottom wall of the jacket 4, so that exchanging the header partition wall 7 can change a capacity of the header 5 or opening areas of the inflow-side opening 6a and the outflow-side opening 6b.

Figure 14:
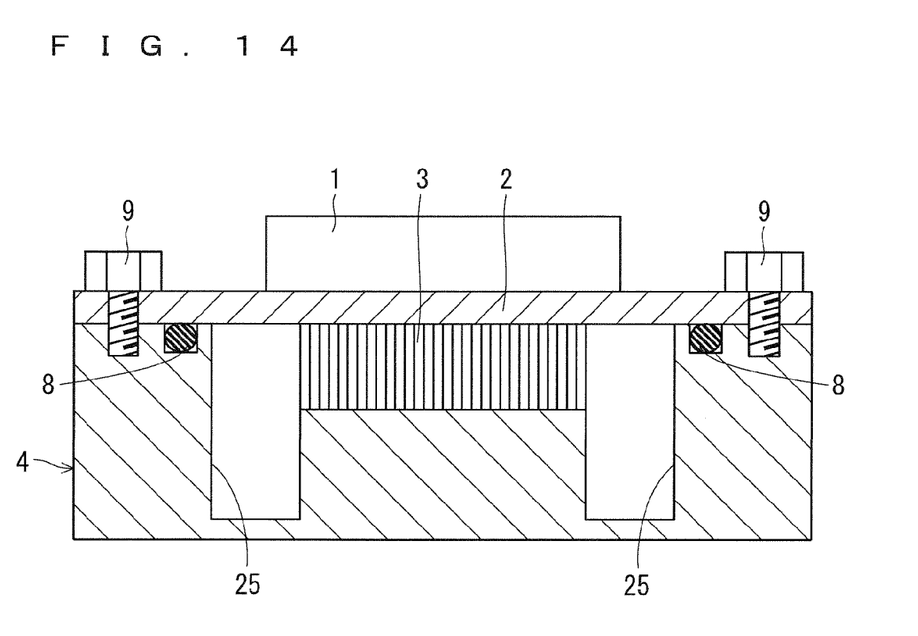
FIG. 14 is a schematic cross sectional view of a semiconductor device according to an underlying technology.

Next, effects of the semiconductor device according to the first preferred embodiment in comparison to a semiconductor device according to an underlying technology will be described. FIG. 14 is a schematic cross sectional view of the semiconductor device according to the underlying technology. As shown in FIG. 14, in the semiconductor device according to the underlying technology, a pair of headers 25 are respectively disposed on the inflow side (left side in FIG. 14) and the outflow side (right side in FIG. 14) of the refrigerant in the cooling fins 3, in other words, they are each adjacently disposed in horizontal to the cooling fins 3, so that the refrigerant structurally flows in a horizontal straight line.

The structure of the semiconductor device according to the underlying technology has a simple shape, but to seal the base plate 2 and the jacket 4, the O-ring 8 needs to surround the outer side of the headers 25, thereby increasing the size of the base plate 2. In other words, the size of the base plate 2 needs to be greater than or equal to a heat dissipation area, and thus reducing the size of the semiconductor device is difficult.

Consequently, the semiconductor device according to the first preferred embodiment includes the semiconductor element 1, the base plate 2 having the upper surface on which the semiconductor element 1 is mounted, the cooling fins 3 disposed on the lower surface of the base plate 2, the jacket 4 is disposed in the sealing manner on the lower surface of the base plate 2, the jacket 4 surrounding the cooling fins 3, and the header partition wall 7 fixed to the jacket 4 on the lower side of the cooling fins 3 inside the jacket 4, the header partition wall 7 forming the header 5 and the flow path 6 for causing the refrigerant flow to the cooling fins 3.

Therefore, as shown in FIG. 1, the cooling fins 3 and the flow path 6 of the header 5 are disposed in the vertical direction instead of the horizontal direction, which eliminates the need to seal a region larger than the region in the base plate 2 in which the cooling fins 3 are formed. In other words, only the region in the base plate 2 in which the cooling fins 3 are formed needs to be sealed, so that the size of the base plate 2 can be reduced, and thus the semiconductor device can be minimized. Consequently, packaging products can also be minimized.

The header partition wall 7 is formed into a T-shape, so that while the header partition wall 7 secures the predetermined strength, the capacity of the header 5 can increase.

The header partition wall 7 is formed separately from the jacket 4, so that in a process of the jacket 4, the generation of undercut portions can be prevented, whereby workability of the jacket 4 can be improved. Thus, yields of the semiconductor device can be improved.

The header partition wall 7 is formed exchangeably, so that exchanging only the header partition wall 7 eliminates the need to exchange the whole jacket 4 in response to a change in specifications. Furthermore, if the capacity of the header 5 or the opening areas of the inflow-side opening 6a and the outflow-side opening 6b need to be changed, exchanging only the header partition wall 7 is sufficient.

The semiconductor element 1 is a wide band gap semiconductor, so that optimum cooling to the semiconductor element 1 can be performed in the semiconductor device according to the preferred embodiment and high heat dissipation can be achieved in operation at high temperatures, thereby improving reliability in operation of the product.

The header partition wall 7 is formed into the T-shape, and even if the vertical partition wall 7a and the horizontal partition wall 7b that form the header partition wall 7 do not have a completely vertical shape and a completely horizontal shape, the effect similar to that mentioned above can be obtained. In addition, the O-ring 8 is used for the sealing structure of the semiconductor element 1 and the jacket 4, and the similar effect of sealing can be obtained when a liquid gasket, a UV curable rubber, or the like is used.

Second Preferred Embodiment

Figure 4:
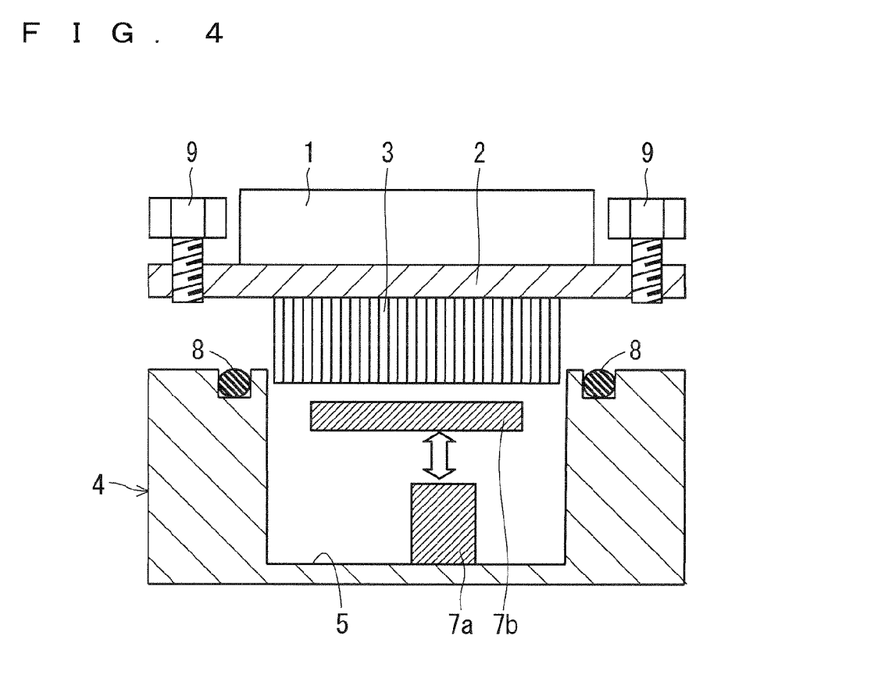
FIG. 4 is a schematic cross sectional view showing a state during assembling in a semiconductor device according to a second preferred embodiment.

Next, a semiconductor device according to a second preferred embodiment will be described. FIG. 4 is a schematic cross sectional view showing a state during assembling in the semiconductor device according to the second preferred embodiment. In the second preferred embodiment, the same components as those described in the first preferred embodiment are denoted by the same references, which are not described here.

In the second preferred embodiment, the header partition wall 7 is formed so as to be dividable into a plurality of pieces. For example, as shown in FIG. 4, the header partition wall 7 has a structure that divides pieces vertically into two. More specifically, in the header partition wall 7, the vertical partition wall 7a and the horizontal partition wall 7b are formed so as to be dividable. The vertical partition wall 7a and the horizontal partition wall 7b are assembled by bolts, for example.

Figure 5:
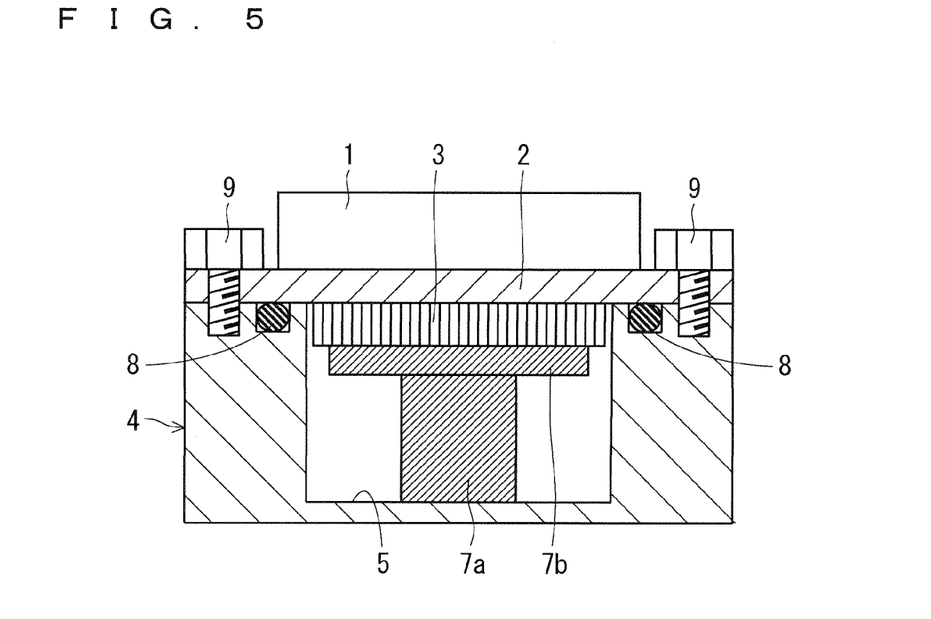
FIG. 5 is a schematic cross sectional view of a semiconductor device according to a first modification of a second preferred embodiment.

Next, a modification of the second preferred embodiment will be described. FIG. 5 is a schematic cross sectional view of a semiconductor device according to a first modification of the second preferred embodiment, and it is a schematic cross sectional view of the semiconductor device in a case where the amount of downward protrusion of the cooling fins 3 is changed (more specifically, in a case where the amount of downward protrusion of the cooling fins 3 is reduced). In this case, only the vertical partition wall 7a is exchanged, and the lower end of a middle portion in a width direction of the cooling fins 3 contacts an upper surface of the horizontal partition wall 7b. Only the vertical partition wall 7a can be exchanged without exchanging the horizontal partition wall 7b, which can handle a change in shapes (change in specifications) of the cooling fins 3 more flexibly. The width direction of the cooling fins 3 refers to a lateral direction of the cooling fins 3 in FIG. 5.

Figure 6:
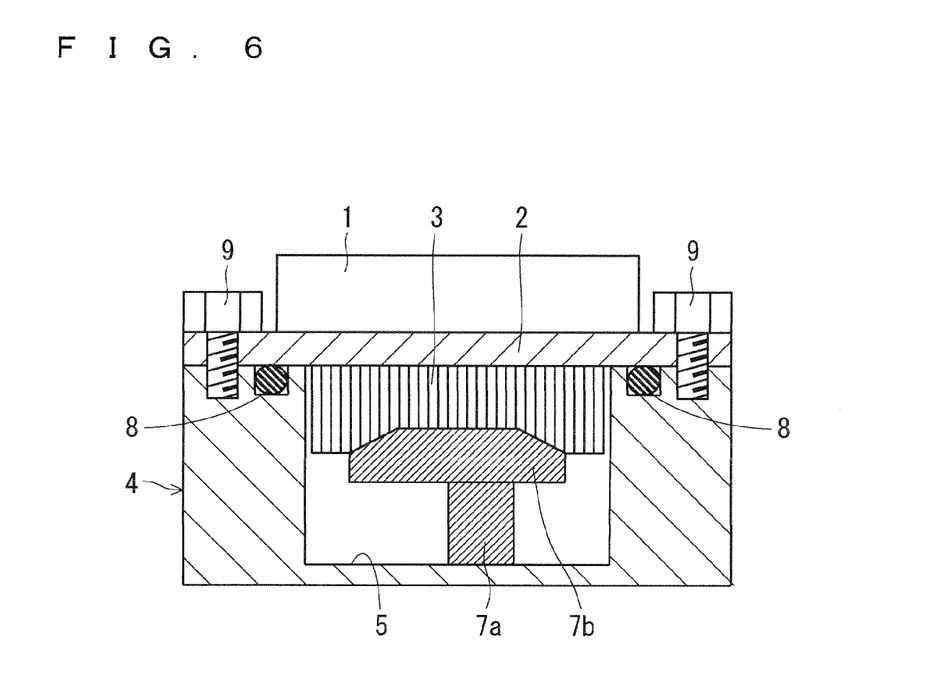
FIG. 6 is a schematic cross sectional view of a semiconductor device according to a second modification of the second preferred embodiment.

Instead of exchanging only the vertical partition wall 7a, only the horizontal partition wall 7b can also be exchanged. FIG. 6 is a schematic cross sectional view of a semiconductor device according to a second modification of the second preferred embodiment, and it is a schematic cross sectional view of the semiconductor device in a case where the amount of downward protrusion of the middle portion is reduced in the width direction of the cooling fins 3. In this case, only the horizontal partition wall 7b is exchanged, and the lower end of the middle portion in the width direction of the cooling fins 3 contacts the upper surface of the horizontal partition wall 7b.

Figure 7:
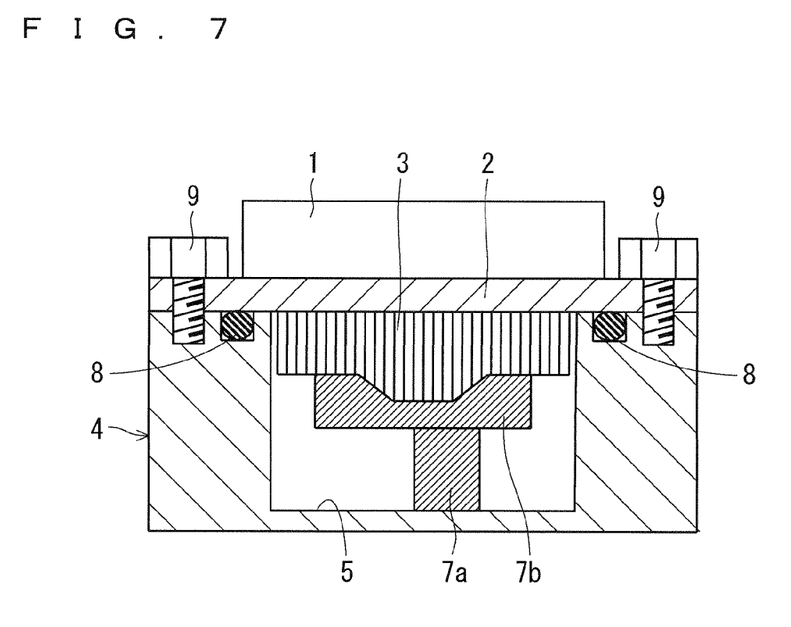
FIG. 7 is a schematic cross sectional view of a semiconductor device according to a third modification of the second preferred embodiment.

FIG. 7 is a schematic cross sectional view of a semiconductor device according to a third modification of the second preferred embodiment, and it is a schematic cross sectional view of the semiconductor device in a case where the amount of downward protrusion increases in the middle portion in the width direction of the cooling fins 3. In this case, only the horizontal partition wall 7b is exchanged, and the lower end of the middle portion in the width direction of the cooling fins 3 contacts the upper surface of the horizontal partition wall 7b.

As described above, in the semiconductor device according to the second preferred embodiment, the header partition wall 7 is formed so as to be dividable into a plurality of pieces, which can handle a change in shapes (change in specifications) of the cooling fins 3 more minutely. For example, in a case where the vertical partition wall 7a and the horizontal partition wall 7b in the header partition wall 7 are formed so as to be dividable, the vertical partition wall 7a is shared to allow for an exchange of only the horizontal partition wall 7b. In addition, the horizontal partition wall 7b is shared to allow for an exchange of only the vertical partition wall 7a.

The header partition wall 7 has a structure that divides pieces into two, and it may have a structure that divides pieces into three or more. The header partition wall 7 having the structure that divides pieces into three or more can be adjusted more finely than the structure that divides pieces into two.

Third Preferred Embodiment

Figure 8:
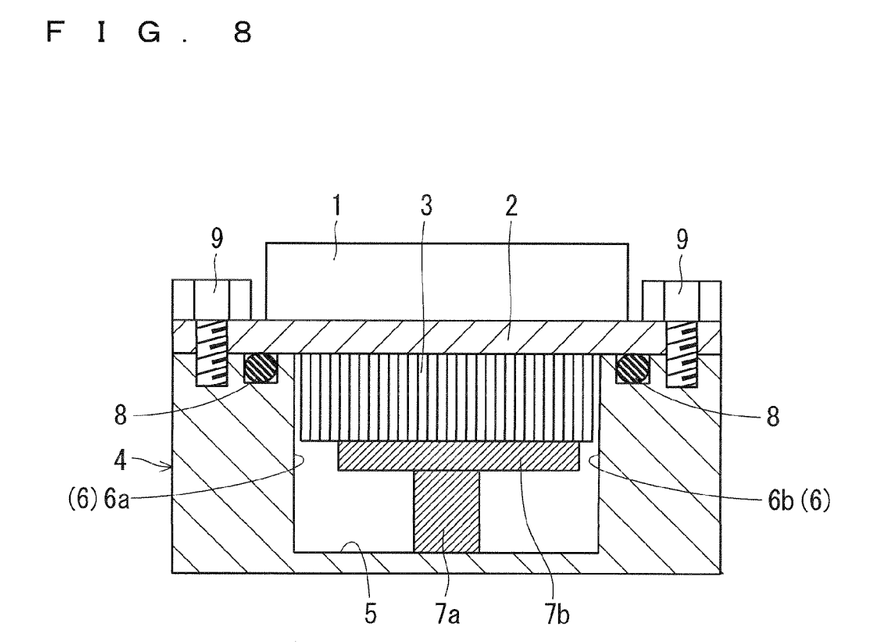
FIG. 8 is a schematic cross sectional view of a semiconductor device according to a third preferred embodiment.

Next, a semiconductor device according to the third preferred embodiment will be described. FIG. 8 is a schematic cross sectional view of the semiconductor device according to the third preferred embodiment. In the third preferred embodiment, the same components as those described in the first and the second preferred embodiments are denoted by the same references, which are not described here.

In the third preferred embodiment, as shown in FIG. 8, the outflow-side opening 6b is formed to be smaller than the inflow-side opening 6a. More specifically, as described above, the inflow-side opening 6a and the outflow-side opening 6b are formed with the inner wall of the jacket 4 and the header partition wall 7. A distance between the inner wall of the header 5 (inner wall on left side in FIG. 8) and one of the side surfaces of the horizontal partition wall 7b (left side surface in FIG. 8) is longer than a distance between the inner wall of the header 5 (inner wall on right side in FIG. 8) and the other side surface of the horizontal partition wall 7b (right side surface in FIG. 8).

As described above, in the third preferred embodiment, the flow path 6 includes the inflow-side opening 6a and the outflow-side opening 6b, and the outflow-side opening 6b is formed to be smaller than the inflow-side opening 6a, so that the amount of the refrigerant flowing out from the cooling fins 3 can be smaller than the amount of the refrigerant flowing into the cooling fins 3, whereby the refrigerant can be temporarily retained between the plurality of cooling fins 3. Thus, flow velocity of the refrigerant flowing through the cooling fins 3 can be equalized.

The shapes of the inflow-side opening 6a and the outflow-side opening 6b are not limited to a case where the side surface of the horizontal partition wall 7b and the inner wall of the jacket 4 are in parallel. For example, it may be a shape in which the side surface of the horizontal partition wall 7b is inclined inwardly as it goes downward, namely, a shape in which the inflow-side opening 6a and the outflow-side opening 6b have greater opening areas as it goes downward. Moreover, it may be a shape in which the side surface of the horizontal partition wall 7b is inclined outwardly as it goes downward, namely, a shape in which the inflow-side opening 6a and the outflow-side opening 6b have smaller opening areas as it goes downward. These cases can also obtain the similar effect to that in the case as described above.

Fourth Preferred Embodiment

Figure 9:
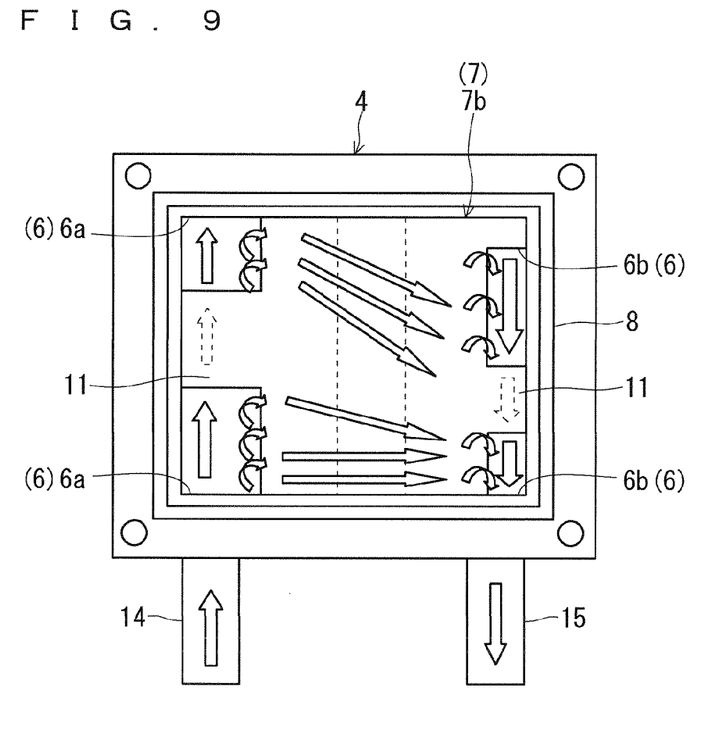
FIG. 9 is a schematic plan view of a jacket of a semiconductor device according to a fourth preferred embodiment.
Figure 10:
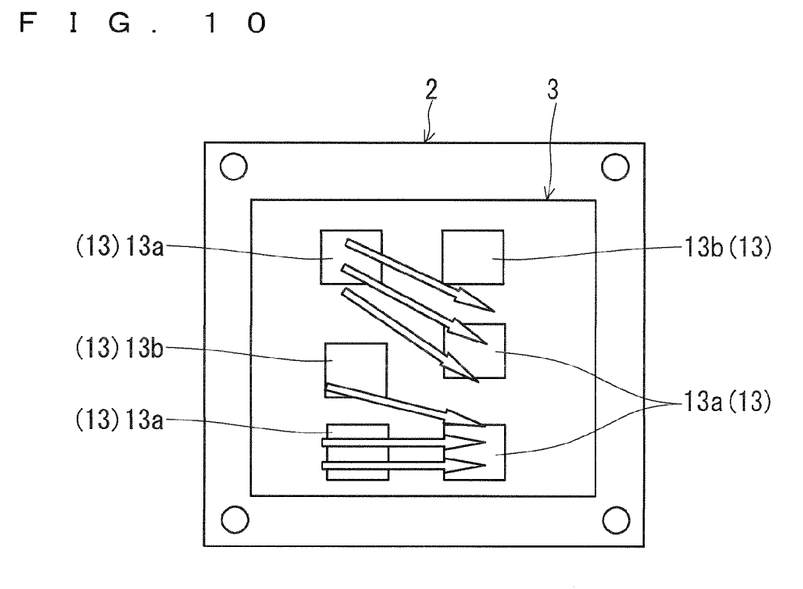
FIG. 10 is a schematic bottom view of a base plate of the semiconductor device according to the fourth preferred embodiment.

Next, a semiconductor device according to a fourth preferred embodiment will be described. FIG. 9 is a schematic plan view of the jacket 4 of the semiconductor device according to the fourth preferred embodiment. FIG. 10 is a schematic bottom view of the base plate 2 of the semiconductor device according to the fourth preferred embodiment. In the fourth preferred embodiment, the same components as those described in the first to the third preferred embodiments are denoted by the same references, which are not described here.

In the fourth preferred embodiment, the header partition wall 7 has a shape different from that in the first to the third preferred embodiments. As shown in FIG. 9, the header partition wall 7 includes a blocking portion 11 that blocks part of the inflow-side opening 6a and the outflow-side opening 6b. The blocking portion 11 has a shape in which part of an end portion in a width direction of the horizontal partition wall 7b is extended in a width direction. The blocking portion 11 blocks the part of the inflow-side opening 6a and the outflow-side opening 6b, so that changing the size and the position of the blocking portion 11 can change the sizes and the positions of the inflow-side opening 6a and the outflow-side opening 6b. The width direction of the horizontal partition wall 7b refers to a lateral direction of the horizontal partition wall 7b in FIG. 9.

The inflow-side opening 6a and the outflow-side opening 6b are formed into rectangles in plan view. An inflow portion 14 causing the refrigerant to flow into the flow path 6 and an outflow portion 15 causing the refrigerant to flow out from the flow path 6 are disposed on an outer periphery of the jacket 4.

Arrows in FIG. 9 indicate directions in which the refrigerant flows. The refrigerant, which flows from the inflow portion 14 through the inflow-side opening 6a, flows through the cooling fins 3 and flows out from the outflow portion 15 through the outflow-side opening 6b. Thus, changing the positions of the inflow-side opening 6a and the outflow-side opening 6b can change the direction in which the refrigerant flows. FIG. 10 shows that the plurality of cooling fins 3 are disposed. The following diagrams are similar.

As shown in FIG. 10, the base plate 2 has a heating region 13, such as the semiconductor element 1 mounted on the base plate 2. The heating region 13 has a high temperature portion 13a and a low temperature portion 13b. To easily cause the refrigerant flow to the high temperature portion 13a, the positions of the inflow-side opening 6a and the outflow-side opening 6b, namely, the position of the blocking portion 11 are determined in consideration of the position of the high temperature portion 13a and the direction in which the refrigerant flows.

As described above, in the semiconductor device according to the fourth preferred embodiment, the flow path 6 includes the inflow-side opening 6a and the outflow-side opening 6b, the header partition wall 7 includes the blocking portion 11 that blocks the part of the inflow-side opening 6a and the outflow-side opening 6b, and the blocking portion 11 blocks the part of the inflow-side opening 6a and the outflow-side opening 6b to change the direction in which the refrigerant flows. Therefore, the refrigerant easily flows to a specific place of the cooling fins 3, so that the refrigerant can flow to the high temperature portion 13a of the heating region 13 in which cooling is especially needed. Thus, the high temperature portion 13a can be cooled effectively.

The inflow-side opening 6a and the outflow-side opening 6b have a rectangular shape in plan view shown as an example, but the shape is not limited to this. A round shape or a polygonal shape in plan view can obtain the similar effect.

Fifth Preferred Embodiment

Figure 11A:
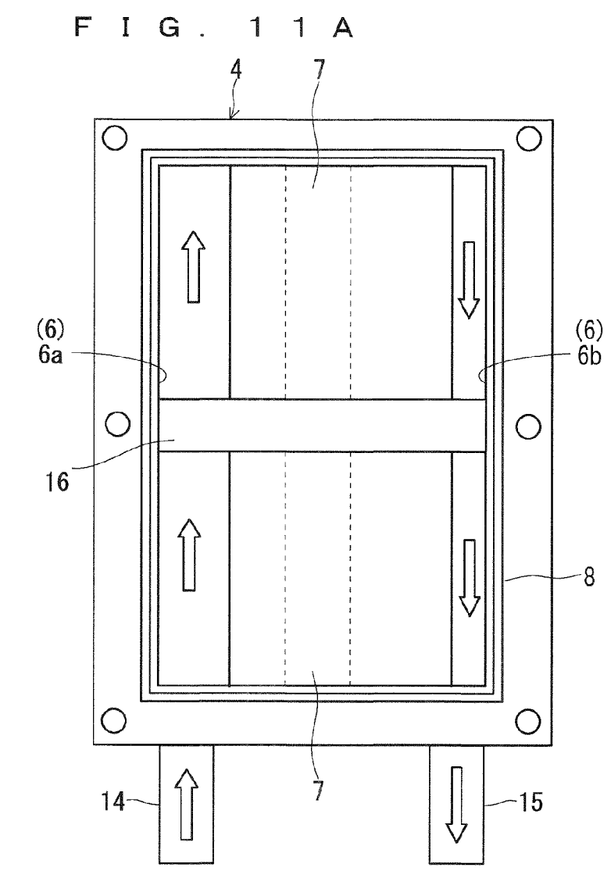
FIG. 11A is a schematic plan view of a jacket of a semiconductor device according to a fifth preferred embodiment.
Figure 11B:
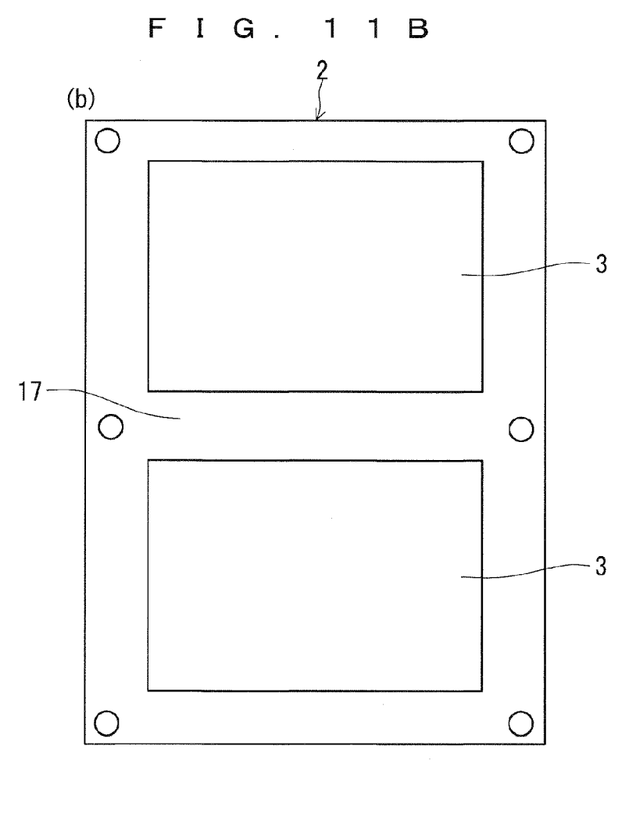
FIG. 11B is a schematic bottom view of a base plate of the semiconductor device according to the fifth preferred embodiment.

Next, a semiconductor device according to a fifth preferred embodiment will be described. FIG. 11A is a schematic plan view of the jacket 4 of the semiconductor device according to the fifth preferred embodiment. FIG. 11B is a schematic bottom view of the base plate 2 of the semiconductor device according to the fifth preferred embodiment. In the fifth preferred embodiment, the same components as those described in the first to the fourth preferred embodiments are denoted by the same references, which are not described here.

As shown in FIG. 11A, the fifth preferred embodiment further includes a header divider 16 formed separately from the jacket 4 and disposed, in the jacket 4, at a position corresponding to a dividing portion 17. The header divider 16 is formed into a bar shape having the same length as that of the width direction in the jacket 4, and it is also formed to have the same dimensions as the dividing portion 17. The width direction of the jacket 4 refers to a lateral direction of the jacket 4 in FIG. 11A.

As shown in FIG. 11B, the cooling fins 3 are disposed in a region of the base plate 2 which is divided into two with the dividing portion 17 therebetween. As shown in FIG. 11A, the header divider 16 is disposed, in the jacket 4, at the position corresponding to the dividing portion 17 and assembled to the jacket 4. The dividing portion 17 refers to a region of the base plate 2 in which the cooling fins 3 are not disposed and to a region that divides the region in which the cooling fins 3 are disposed into a plurality of regions.

In a state in which the header divider 16 is assembled to the inside of the jacket 4, an upper surface of the header divider 16 is closely adhered to the dividing portion 17, so that the refrigerant does not flow from one of the cooling fins 3 to the other cooling fins 3 through the dividing portion 17.

As described above, the semiconductor device according to the fifth preferred embodiment further includes the header divider 16 formed separately from the jacket 4 and disposed, in the jacket 4, at the position corresponding to the dividing portion 17 that divides the region of the base plate 2 in which the cooling fins 3 are disposed into a plurality of regions. This prevents the refrigerant from flowing into the dividing portion 17 and bypassing the region in which one of the cooling fins 3 is disposed to flow into the region in which the other cooling fins 3 are disposed. Consequently, the refrigerant flows through the cooling fins 3 normally, and thus effective heat dissipation can be achieved.

Figure 12A:
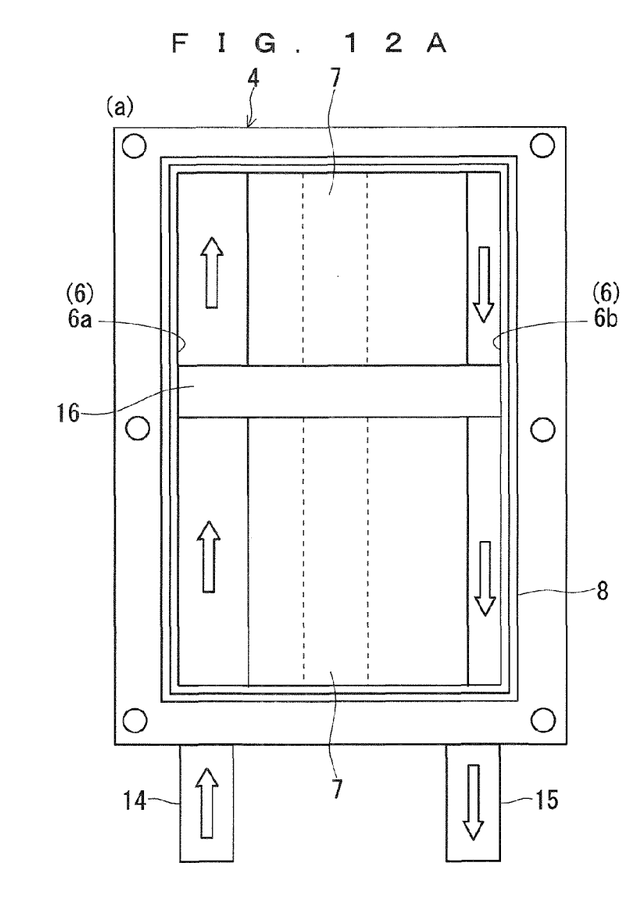
FIG. 12A is a schematic plan view showing a state in which a position of a dividing portion has been changed in the jacket of the semiconductor device according to the fifth preferred embodiment.
Figure 12B:
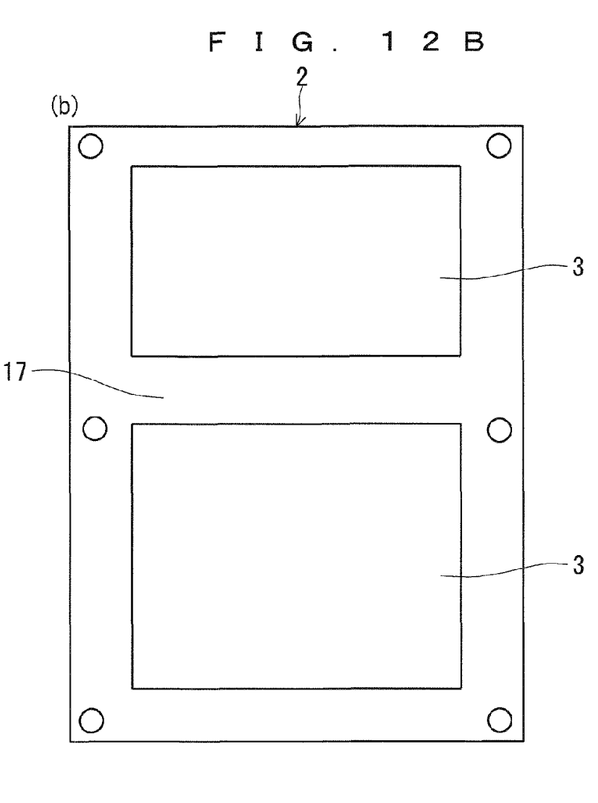
FIG. 12B is a schematic bottom view showing a state in which the position of the dividing portion has been changed in the base plate of the semiconductor device according to the fifth preferred embodiment.

Moreover, the header divider 16 is formed to be changeable in its position in the jacket 4. FIG. 12A is a schematic plan view showing a state in which a position of the dividing portion 17 has been changed in the jacket 4 of the semiconductor device according to the fifth preferred embodiment. FIG. 12B is a schematic bottom view showing a state in which the position of the dividing portion 17 has been changed in the base plate 2 of the semiconductor device according to the fifth preferred embodiment. As shown in FIGS. 12A and 12B, if a change in specifications of the semiconductor element 1 occurs, and for example, the region of the base plate 2 in which the cooling fins 3 are disposed is changed, the whole jacket 4 does not need to be exchanged. An exchange of the header partition wall 7 and a change in the position of the header divider 16 are sufficient, and thus functional added value is high.

As described above, the header divider 16 is formed to be changeable in its position in the jacket 4. Consequently, even in a case where a change in specifications of the semiconductor element 1 occurs and the position of the dividing portion 17 is changed, the change in the position of the header divider 16 can prevent the bypass as mentioned above.

Figure 13A:
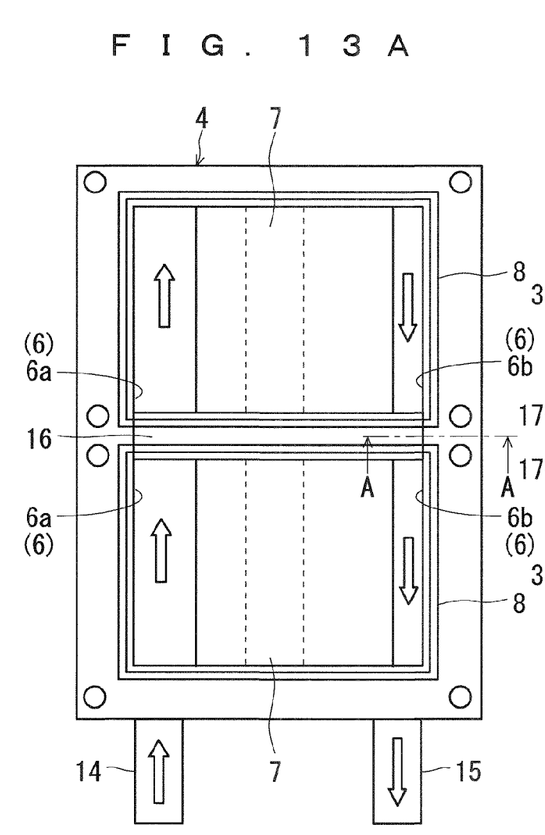
FIG. 13A is a schematic plan view of a jacket of a semiconductor device according to a modification of the fifth preferred embodiment.
Figure 13B:
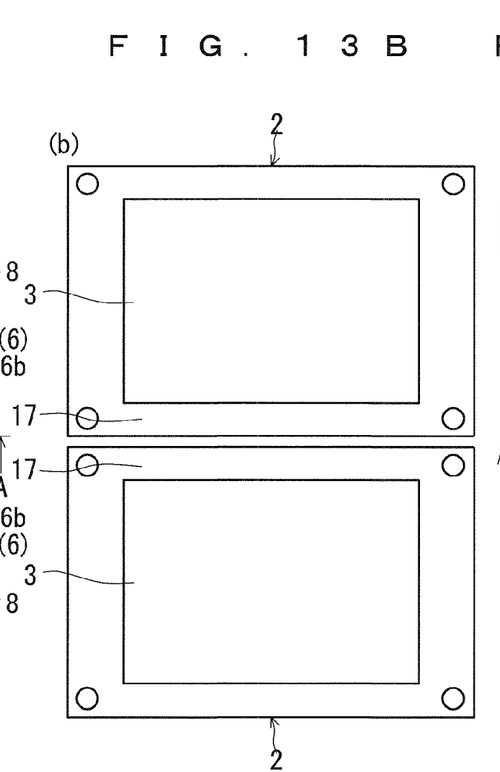
FIG. 13B is a schematic bottom view of a base plate of a semiconductor device according to the modification of the fifth preferred embodiment.
Figure 13C:
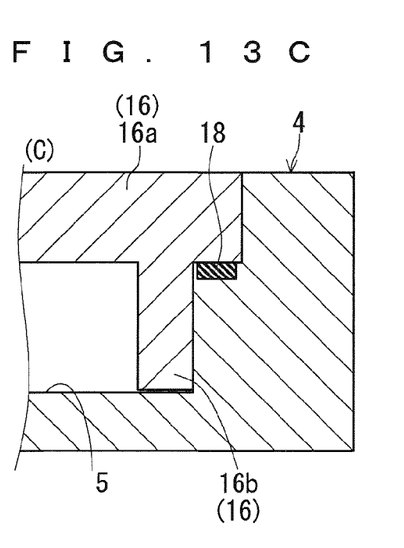
FIG. 13C is a cross sectional view taken along an A-A line in FIG. 13A.

Next, a modification of the fifth preferred embodiment will be described. FIG. 13A is a schematic plan view of the jacket 4 of the semiconductor device according to the modification of the fifth preferred embodiment. FIG. 13B is a schematic bottom view of the base plate 2 of the semiconductor device according to the modification of the fifth preferred embodiment. FIG. 13C is a cross sectional view taken along an A-A line in FIG. 13A.

The modification of the fifth preferred embodiment shows that there are a plurality of semiconductor elements 1 (for example, two). As shown in FIGS. 13A and 13B, in the semiconductor device according to the modification of the fifth preferred embodiment, the semiconductor elements 1 are each mounted on the upper surfaces of the two base plates 2, and the two base plates 2 are assembled to one jacket 4. The dividing portions 17 are disposed at end portions adjacent to each other in the two base plates 2.

As shown in FIG. 13C, the header divider 16 includes a main body portion 16a in a bar shape and a protruding portion 16b protruding downward inside both end portions in a longitudinal direction of the main body portion 16a. The upper surface of the header divider 16 is provided with grooves (not shown) to which the O-ring 8 can be assembled along the longitudinal direction. With the grooves provided in the header divider 16, the jacket 4 can be divided for each semiconductor element 1 (each base plate 2).

As shown in FIG. 13C, the header divider 16 is fixed to the jacket 4 with a liquid gasket 18 disposed on both the end portions in the longitudinal direction of the main body portion 16a to prevent leakage of refrigerant. The liquid gasket 18 is used to ensure water-stopping performance in the header divider 16, and a rubber gasket such as an O-ring, an epoxy adhesive, metal putty, or the like may be used.

As described above, the modification of the fifth preferred embodiment can prevent the refrigerant from bypassing the region in which one of the cooling fins 3 is disposed to flow into the region in which the other cooling fins 3 are disposed through the dividing portion 17.

Although the fifth preferred embodiment and the modification that provide one dividing portion 17 and one header divider 16 have been described, this is not restrictive. If the dividing portion 17 is provided two or more, the same number of the header divider 16 may be used.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor element;
   a base plate having an upper surface on which said semiconductor element is mounted;
   a cooling fin disposed on a lower surface of said base plate;
   a jacket disposed in a sealing manner on the lower surface of said base plate, said jacket surrounding said cooling fin; and
   a header partition wall formed separately from said jacket and fixed to said jacket on the lower side of said cooling fin in said jacket, said header partition wall forming a header and a flow path for causing a refrigerant flow to said cooling fin and exchangeable relative to the jacket that surrounds the cooling fin.

2. The semiconductor device according to claim 1, wherein said header partition wall is formed into a T-shape.

3. The semiconductor device according to claim 1, wherein said header partition wall is formed so as to be dividable into a plurality of pieces.

4. The semiconductor device according to claim 1, wherein
   said flow path includes an inflow-side opening and an outflow-side opening, and
   said outflow-side opening is formed to be smaller than said inflow-side opening.

5. The semiconductor device according to claim 1, wherein
   said flow path includes an inflow-side opening and an outflow-side opening,
   said header partition wall includes a blocking portion that blocks part of said inflow-side opening and said outflow-side opening, and
   said blocking portion blocks the part of said inflow-side opening and said outflow-side opening to change a direction in which a refrigerant flows.

6. The semiconductor device according to claim 1, further comprising a header divider formed separately from said jacket and disposed, in said jacket, at a position corresponding to a dividing portion that divides a region in said base plate where said cooling fin is disposed into a plurality of regions.

7. The semiconductor device according to claim 6, wherein said header divider is formed to be changeable in its position in said jacket.

8. The semiconductor device according to claim 1, wherein said semiconductor element is a wide band gap semiconductor element.

* * * * *